(12) United States Patent
Moriyama

(10) Patent No.: US 12,203,008 B2
(45) Date of Patent: Jan. 21, 2025

(54) POLISHING SLURRY

(71) Applicant: NITTA DuPont Incorporated, Osaka (JP)

(72) Inventor: Kazuki Moriyama, Kyoto (JP)

(73) Assignee: NITTA DUPONT INCORPORATED, Osaka (JP)

( * ) Notice: Subject to any disclaimer, the term of this patent is extended or adjusted under 35 U.S.C. 154(b) by 27 days.

(21) Appl. No.: 17/788,358

(22) PCT Filed: Dec. 26, 2019

(86) PCT No.: PCT/JP2019/051054
§ 371 (c)(1),
(2) Date: Jun. 23, 2022

(87) PCT Pub. No.: WO2021/130947
PCT Pub. Date: Jul. 1, 2021

(65) Prior Publication Data
US 2023/0039134 A1    Feb. 9, 2023

(51) Int. Cl.
*C09G 1/02*    (2006.01)

(52) U.S. Cl.
CPC ..................... *C09G 1/02* (2013.01)

(58) Field of Classification Search
CPC .................... C09G 1/02; C09K 3/14
See application file for complete search history.

(56) References Cited

U.S. PATENT DOCUMENTS

| | | | |
|---|---|---|---|
| 2001/0005009 A1* | 6/2001 | Tsuchiya | C09G 1/02 252/79 |
| 2001/0006225 A1* | 7/2001 | Tsuchiya | H01L 21/3212 252/79 |
| 2003/0153183 A1 | 8/2003 | Konno et al. | |
| 2005/0022456 A1 | 2/2005 | Babu et al. | |
| 2006/0201914 A1 | 9/2006 | Uchikura et al. | |
| 2009/0221213 A1* | 9/2009 | Namie | C09G 1/02 451/36 |
| 2009/0289217 A1 | 11/2009 | Sato et al. | |
| 2010/0015807 A1 | 1/2010 | Kim et al. | |
| 2013/0020283 A1 | 1/2013 | Ono et al. | |
| 2014/0011360 A1 | 1/2014 | Namie et al. | |

FOREIGN PATENT DOCUMENTS

| | | |
|---|---|---|
| CN | 1831076 | 9/2006 |
| CN | 101496143 | 7/2009 |
| CN | 101541913 | 9/2009 |
| CN | 102834479 | 12/2012 |
| EP | 1333476 | 8/2003 |
| EP | 2071615 | 6/2009 |
| JP | 2006-202892 | 8/2006 |
| JP | 2010-512657 | 4/2010 |
| JP | 2010512657 A * | 4/2010 |
| JP | 2012-084895 | 4/2012 |
| JP | 5459466 | 4/2014 |
| JP | 2020-019863 | 2/2020 |
| KR | 20090059109 A | 6/2009 |
| WO | 2009/133793 | 11/2009 |
| WO | 2010/098278 | 9/2010 |

OTHER PUBLICATIONS

JP 2010512657 Machine Translation from JPlat Pat (Year: 2024).*
Performance of Sodium Dodecyl Sulfate in Slurry with Glycine and Hydrogen Peroxide for Copper-Chemical Mechanical Polishing Yan Pan et al. 2010 J. Electrochem. Soc. 157 H1082 DOI 10.1149/1.3494159 (Year: 2010).*
Effect of Hydrogen Peroxide on Oxidation of Copper in CMP Slurries Containing Glycine Serdar Aksu et al. 2003 J. Electrochem. Soc. 150 G718 DOI: 10.1149/1.1615611 (Year: 2003).*
Korean Office Action dated Sep. 19, 2024, issued in corresponding application No. KR 2022-7016712 (pp. 1-4).

\* cited by examiner

*Primary Examiner* — Alexandra M Moore
(74) *Attorney, Agent, or Firm* — Millen White Zelano & Branigan; Christopher Brody

(57) ABSTRACT

A polishing slurry according to the present invention is a polishing slurry for polishing copper or a copper alloy, the polishing slurry including abrasives, an organic acid, an oxidizing agent, and alkali. The polishing slurry further includes polycarboxylic acid, and alkylbenzenesulfonic acid, in which a concentration of the polycarboxylic acid is 0.1 to 0.5 mass % in terms of concentration of sodium polycarboxylate, and a concentration of the alkylbenzenesulfonic acid is 0.3 mass % or more in terms of concentration of alkylbenzenesulfonate triethanolamine.

5 Claims, No Drawings

POLISHING SLURRY

FIELD

The present invention relates to a polishing slurry.

BACKGROUND

Conventionally, a printed-circuit board manufactured in the following manner has been known. First, a groove pattern is formed on a resin sheet. Next, a copper layer is formed by layering copper or a copper alloy on the resin sheet so as to fill the copper or the copper alloy in the groove pattern. Then, the copper alloy excessively layered on a resin layer formed by the resin sheet is removed by chemical mechanical polishing (CMP), to thereby obtain a printed-circuit board with the groove pattern filled with copper or the copper alloy. As such a polishing slurry used for polishing a copper layer, for example, a polishing slurry including abrasives, an organic acid, a surfactant, an oxidizing agent, and a pH adjustor is known (e.g., Patent Literature 1).

CITATION LIST

Patent Literature

Patent Literature 1: JP 5459466 B. SUMMARY OF THE INVENTION

Technical Problem

Meanwhile, a high removal rate can be demanded in terms of efficiency of polishing in the polishing such as CMP. In order to improve the removal rate, it is conceivable that the concentration of abrasives is increased. However, sufficient study has not been made on a polishing slurry that can improve a removal rate in other ways than increasing the concentration of the abrasives.

Also demanded for the polishing slurry is to capable of hardly causing etching on copper or a copper alloy filled in a groove pattern.

It is an object of the present invention to provide a polishing slurry that can improve a removal rate and hardly cause etching on copper or a copper alloy.

Solution to Problem

A polishing slurry according to the present invention is a polishing slurry for polishing copper or a copper alloy, the polishing slurry including abrasives, an organic acid, an oxidizing agent, and alkali, the polishing slurry further including polycarboxylic acid, and alkylbenzenesulfonic acid, in which a concentration of the polycarboxylic acid is 0.1 to 0.5 mass % in terms of concentration of sodium polycarboxylate, and a concentration of the alkylbenzenesulfonic acid is 0.3 mass % or more in terms of concentration of alkylbenzenesulfonate triethanolamine.

Here, as one form of the polishing slurry according to the present invention, it includes glycine as the organic acid.

As another form of the polishing slurry according to the present invention, it includes hydrogen peroxide as the oxidizing agent.

As still another form of the polishing slurry according to the present invention, it includes ammonia as the alkali.

As still another form of the polishing slurry according to the present invention, a concentration of the abrasives is 1.0 mass % or less.

As still another form of the polishing slurry according to the present invention, it has a pH of 9.0 or more.

DETAILED DESCRIPTION OF THE PREFERRED EMBODIMENT

An embodiment of the present invention will be hereinafter described.

A polishing slurry according to this embodiment is a polishing slurry for polishing copper or a copper alloy.

Hereinafter, a description will be given by taking, for example, a polishing slurry that is used to polish a polishing object, which includes a copper layer as a surface layer and a resin layer formed of a resin, arranged adjacent to the surface layer and laminated thereon, from the surface layer side.

The polishing object includes a resin layer, a groove is formed in the resin layer, and the groove is filled with copper or the copper alloy. The polishing object can be obtained by forming a groove pattern with a groove on the resin sheet using a laser beam and plating the groove with copper or the copper alloy. At the time of the plating, excess copper or copper alloy is formed on the resin layer formed by a resin sheet. The polishing slurry according to this embodiment is used for removing the excess copper or copper alloy. Examples of a material to form the resin sheet include an epoxy resin. Examples of the material also include a mixture of the epoxy resin and a silica filler. Examples of the mixture of the epoxy resin and the silica filler include Ajinomoto built up film (ABF). Examples of the mixture of the epoxy resin and the silica filler include a mixture including 5 to 95 mass % of the epoxy resin and 5 to 95 mass % of the silica filler. The polishing object is polished by the polishing slurry and thereafter used as, for example, a printed-circuit board.

The polishing slurry according to this embodiment includes abrasives, an organic acid, an oxidizing agent, and alkali, and further includes polycarboxylic acid and alkylbenzenesulfonic acid. The polishing slurry according to this embodiment includes the abrasives to make it possible to improve the removal rate. The polishing slurry according to this embodiment includes the organic acid so that the organic acid and copper or the organic acid and copper included in a copper alloy can form a complex, which results in making it possible to improve the removal rate. The polishing slurry according to this embodiment includes the oxidizing agent so that copper or copper included in a copper alloy can be oxidized, which results in making it possible to improve the removal rate. The polishing slurry according to this embodiment includes alkali to thereby make it possible to easily have a pH of the polishing slurry at a given value. The polishing slurry according to this embodiment includes the polycarboxylic acid to make it possible to improve the removal rate. In other words, the polycarboxylic acid functions as a polishing accelerator in the polishing slurry according to this embodiment. The polishing slurry according to this embodiment includes alkylbenzenesulfonic acid so that a protective film is formed on copper or a copper alloy of the polishing object to thereby capable of hardly causing etching on copper or the copper alloy. In other words, the alkylbenzenesulfonic acid functions as a protective film forming agent in the polishing slurry according to this embodiment.

In the polishing slurry according to this embodiment, it is important that the concentration of the polycarboxylic acid be 0.1 to 0.5 mass % in terms of concentration of sodium polycarboxylate, preferably be 0.3 to 0.5 mass %. The polishing slurry according to this embodiment having a concentration of polycarboxylic acid of 0.1 mass % or more in terms of concentration of sodium polycarboxylate can improve the removal rate. The polishing slurry according to this embodiment having a concentration of polycarboxylic acid of 0.5 mass % or less in terms of concentration of sodium polycarboxylate can decrease the etching rate.

In the polishing slurry according to this embodiment, it is important that the concentration of the alkylbenzenesulfonic acid be 0.3 mass % or more in terms of concentration of alkylbenzenesulfonate triethanolamine, preferably be 0.3 to 1.2 mass %. The polishing slurry according to this embodiment having a concentration of the alkylbenzenesulfonic acid of 0.3 mass % or more in terms of concentration of alkylbenzenesulfonate triethanolamine can decrease the etching rate. Further, the alkylbenzenesulfonic acid functions as a protective film forming agent and therefore has a tendency to decrease the removal rate. Therefore, the polishing slurry according to this embodiment having a concentration of the alkylbenzenesulfonic acid of 1.2 mass % or less in terms of concentration of alkylbenzenesulfonate triethanolamine can further improve the removal rate.

In the polishing slurry according to this embodiment, a concentration of the abrasives is preferably 1.0 mass % or less, more preferably 0.01 to 1.0 mass %. The polishing slurry according to this embodiment having a concentration of the abrasives of 1.0 mass % or less can suppress the occurrence of scratches. Also, the polishing slurry according to this embodiment having a concentration of the abrasives of 0.01 mass % or more can increase the removal rate.

In the polishing slurry according to this embodiment, a concentration of the organic acid is preferably 0.01 to 10 mass %, more preferably 1.0 to 5.0 mass %.

In the polishing slurry according to this embodiment, a concentration of the oxidizing agent is preferably 0.01 to 5.0 mass %, more preferably 1.0 to 3.0 mass %.

In the polishing slurry according to this embodiment, a pH is preferably 9.0 or more, more preferably 9.0 to 11.0. In the polishing slurry according to this embodiment, it is preferable that the concentration of the alkali be adjusted so that the pH falls in the aforementioned range. For example, the concentration of the alkali is preferably 0.01 to 2.0 mass %, more preferably 0.1 to 1.0 mass %.

Examples of carboxylic acid monomer that forms the polycarboxylic acid include substituted or unsubstituted acrylic acid, and substituted or unsubstituted methacrylic acid. Examples of the substituted acrylic acid include alkyl acrylate. Examples of alkyl acrylate include methyl acrylate, and ethyl acrylate. Examples of the substituted methacrylic acid include alkyl methacrylate. Examples of alkyl methacrylate include methyl methacrylate, and ethyl methacrylate, and n in the alkyl group ($C_nH_{2n+3}$) of alkyl methacrylate can be 3 or more. Examples of the polycarboxylic acid include a homopolymer of carboxylic acid monomer, a copolymer of a plurality of carboxylic acid monomers, and a copolymer of carboxylic acid monomer with a monomer other than carboxylic acid monomer. Polycarboxylic acid can be included in the polishing slurry according to this embodiment by mixing polycarboxylate and other materials of the polishing slurry. Examples of polycarboxylate include sodium polyacrylate.

A weight average molecular weight of the polycarboxylic acid in terms of polycarboxylate is preferably $1.0 \times 10^3$ to $1.0 \times 10^7$, more preferably $1.0 \times 10^4$ to $1.0 \times 10^6$. The weight average molecular weight can be determined by gel permeation chromatography (GPC).

The polycarboxylic acid is a polycarboxylic acid that causes an etching rate of a solution including 5.0 mass % of glycine, 0.6 mass % of ammonia, 0.5 mass % of polycarboxylic acid, and water as the residue to be preferably 380 μm/min or more, more preferably 400 to 1000 μm/min, still more preferably 450 to 800 μm/min, particularly preferably 500 to 600 μm/min. The polycarboxylic acid is a polycarboxylic acid that causes an etching rate of a solution including 5.0 mass % of glycine, 0.6 mass % of ammonia, 1.2 mass % of alkylbenzenesulfonate (e.g., dodecylbenzene sulfonate triethanolamine), 2.0 mass % of polycarboxylic acid and water as the residue to be preferably 15 μm/min or more, more preferably 30 to 500 μm/min, still more preferably 50 to 300 μm/min, particularly preferably 60 to 100 μm/min. The etching rate can be measured by the method described in Examples to be described later. The abrasives and the defoamer used in Examples to be described later are abrasives and a defoamer which have no influence on the value of the etching rate.

Examples of the alkylbenzene sulfonic acid include dodecylbenzene sulfonic acid, decylbenzene sulfonic acid, undecylbenzene sulfonic acid, tridecylbenzene sulfonic acid, and tetrabenzene sulfonic acid. Alkylbenzene sulfonic acid can be included in the polishing slurry according to this embodiment by mixing alkylbenzenesulfonate and other materials of the polishing slurry. Examples of alkylbenzenesulfonate include sodium alkylbenzenesulfonate and alkylbenzenesulfonic acid neutralized with triethanolamine (TEA) (i.e., alkylbenzenesulfonate triethanolamine).

Examples of the abrasives include inorganic particles, organic particles, and organic-inorganic composite particles. Examples of the inorganic particles include silica particles, alumina particles, titania particles, zirconia particles, ceria particles, and calcium carbonate particles. Examples of the silica particles include fumed silica particles, colloidal silica particles, and silica particles obtained by a sol-gel method. Examples of the organic particles include organic polymer particles such as polyethylene, polypropylene, poly-1-buten, poly-4-methyl-1-pentene, olefin copolymer, polystyrene, styrene copolymer, polyvinyl chloride, polyacetal, saturated polyester, polyamide, polycarbonate, phenoxy resin, polymethyl methacrylate, (meth)acrylic resin, and acrylic copolymer. Examples of the organic-inorganic composite particles include particles or the like obtained by polycondensation of alkoxide compound of metal or silicon (e.g., alkoxysilane, aluminum alkoxide, titanium alkoxide) in the presence of organic particles. Different particles described above can be used as the abrasives. The abrasives are preferably inorganic particles, more preferably silica particles, particularly preferably colloidal silica particles. The abrasives preferably include 80 to 100 mass % of colloidal silica particles, more preferably 90 to 100 mass %, still more preferably 100 mass %. In the polishing slurry according to this embodiment, the concentration of the colloidal silica particles is preferably 1.0 mass % or less, more preferably 0.01 to 1.0 mass %.

Examples of the organic acid include amino acid and carboxylic acid. Examples of the amino acid include glycine, glutamic acid, and aspartic acid. Examples of the carboxylic acid include formic acid, acetic acid, propionic acid, butyric acid, oxalic acid, malonic acid, succinic acid, benzoic acid, phthalic acid, salicylic acid, tartaric acid, citric acid, gluconic acid, glyoxylic acid, and malic acid. The organic acid preferably includes 80 to 100 mass % of glycine, more preferably 90 to 100 mass %, still more preferably 100 mass %. In the polishing slurry according to this embodiment, the concentration of the glycine is preferably 10 mass % or less, more preferably 1.0 to 5.0 mass %.

Examples of the oxidizing agent include hydrogen peroxide, organic peroxide, permanganic acid compound, dichromic acid compound, halogenic acid compound, nitric acid, nitric acid compound, perhalogenic acid compound, persulfate, and heteropoly acid. Examples of the organic peroxide include peracetic acid, perbenzoic acid, and tert-butyl hydroperoxide. Examples of the permanganic acid compound include potassium permanganate. Examples of the dichromic acid compound include potassium dichromate. Examples of the halogen acid compound include potassium iodinate. Examples of the nitric acid compound include iron nitrate. Examples of the perhalogenic acid compound include perchloric acid. Examples of the persulfate include ammonium persulfate. Different oxidizing agents described above can be used as the oxidizing agent. As the oxidizing agent, hydrogen peroxide is preferable. The oxidizing agent preferably includes 80 to 100 mass % of hydrogen peroxide, more preferably 90 to 100 mass %, still more preferably 100 mass %. In the polishing slurry according to this embodiment, the concentration of the hydrogen peroxide is preferably 5.0 mass % or less, more preferably 1.0 to 3.0 mass %.

Examples of the alkali include ammonia, sodium hydroxide, and potassium hydroxide. As the alkali, ammonia is preferable. The alkali preferably includes 80 to 100 mass % of ammonia, more preferably 90 to 100 mass %, still more preferably 100 mass %.

The polishing slurry according to this embodiment is configured as above and thus has the following advantages.

As a result of diligent studies, the present inventors have found that additional inclusion of a certain amount of alkylbenzenesulfonic acid and a certain amount of polycarboxylic acid in the polishing slurry including abrasives, an organic acid, an oxidizing agent, and alkali can improve the removal rate and hardly cause etching on copper or a copper alloy. Consequently, the present inventors have arrived at the present invention. That is, the polishing slurry according to this embodiment is a polishing slurry for polishing copper or a coper alloy. The polishing slurry according to this embodiment includes abrasives, an organic acid, an oxidizing agent, and alkali. The polishing slurry according to this embodiment further includes polycarboxylic acid and alkylbenzenesulfonic acid. The concentration of the polycarboxylic acid is 0.1 to 0.5 mass % in terms of concentration of sodium polycarboxylate. The concentration of the alkylbenzenesulfonic acid is 0.3 mass % or more in terms of concentration of alkylbenzenesulfonate triethanolamine. According to this embodiment, it is possible to provide a polishing slurry that can improve the removal rate and hardly cause etching on copper or a copper alloy.

The polishing slurry according to the present invention is not limited to the configuration of the aforementioned embodiment. Further, the polishing slurry according to the present invention is not limited to those having the aforementioned operational effects. Various modifications can be made to the polishing slurry according to the present invention without departing from the gist of the present invention.

EXAMPLES

Next, the present invention will be further specifically described with reference to Examples and Comparative Examples.

Examples and Comparative Examples

The polishing slurry of each of Examples and Comparative Examples with the composition showing in Tables 1 to 3 below was prepared. The abrasives used herein are colloidal silica particles (PL-3 manufactured by FUSO CHEMICAL CO., LTD.). The organic acid used herein is glycine. The alkali used herein is ammonia. The alkylbenzenesulfonate used herein is dodecylbenzene sulfonate triethanolamine. Polycarboxylate 1 used in Tables is sodium of carboxylic acid copolymer (weight average molecular weight of the sodium of carboxylic acid copolymer: 500,000). Polycarboxylate 2 used in Tables is sodium polyacrylate (weight average molecular weight of the sodium polyacrylate: 500,000). Polycarboxylate 3 used in Tables is sodium polycarboxylate (weight average molecular weight of the sodium polycarboxylate: 10,000). The oxidizing agent used herein is hydrogen peroxide. The defoamer used herein is a silicone emulsion.

<Removal Rate (RR) Test>

Using the polishing slurry of each of Examples and Comparative Examples, a polishing object was polished in the following conditions to determine a removal rate.

Polishing object: a glass epoxy resin plated with copper
Polishing machine: ECOMET4
Polishing pressure: 5 psi
Slurry flow rate: 50 mL/min
Number of revolutions of platen/number of revolutions of head: 120 rpm/67 rpm
Polishing time: 10 min
Polishing pad: product name SUBA600 XY (manufactured by Nitta Haas Incorporated)

<Etching Rate (ER) Test>

A glass epoxy resin plated with copper was used as an object. The object was immersed in a polishing slurry for 30 minutes. The etching rate was determined by each of the mass before and after the object was immersed.

<Corrosion of Polishing Object>

After the removable rate test, the polishing object was visually observed to see the presence or absence of corrosion.

<Suppression of Scratches>

After the removable rate test, the polishing object was visually observed to see scratches. The observation was not performed on a corroded polishing object.

x: a number of scratches were observed.
Δ: some scratches were observed.
○: no scratch was observed.

<pH of Polishing Slurry>

The pH of the polishing slurry was measured using a pH meter.

Test results are also shown in Tables 1 to 3.

TABLE 1

|  |  | C. Ex. 1 | Ex. 1 | Ex. 2 | Ex. 3 | C. Ex. 2 | Ex. 4 | Ex. 5 |
|---|---|---|---|---|---|---|---|---|
| Composition of polishing slulry (mass %) | Abrasives | 3.0 | 3.0 | 3.0 | 3.0 | 3.0 | 2.0 | 1.0 |
|  | Glycine | 5.0 | 5.0 | 5.0 | 5.0 | 5.0 | 5.0 | 5.0 |
|  | Ammonia | 0.6 | 0.6 | 0.6 | 0.6 | 0.6 | 0.6 | 0.6 |
|  | Akylbenzenesulfonate | 1.2 | 1.2 | 1.2 | 1.2 | 1.2 | 1.2 | 1.2 |
|  | Polycarboxylate 1 | — | 0.1 | 0.3 | 0.5 | 1.0 | 0.5 | 0.5 |

TABLE 1-continued

|  | C. Ex. 1 | Ex. 1 | Ex. 2 | Ex. 3 | C. Ex. 2 | Ex. 4 | Ex. 5 |
|---|---|---|---|---|---|---|---|
| Polycarboxylate 2 | — | — | — | — | — | — | — |
| Polycarboxylate 3 | — | — | — | — | — | — | — |
| Hydrogen peroxide solution | 2.0 | 2.0 | 2.0 | 2.0 | 2.0 | 2.0 | 2.0 |
| Defoamer | 0.1 | 0.1 | 0.1 | 0.1 | 0.1 | 0.1 | 0.1 |
| Water | 88.1 | 88.0 | 87.8 | 87.6 | 87.1 | 88.6 | 89.6 |
| RR (μm/min) | 2.86 | 3.10 | 3.37 | 4.58 | 5.24 | 4.44 | 4.16 |
| ER (nm/min) | 10.9 | 10.0 | 10.7 | 11.4 | 16.7 | 12.1 | 11.4 |
| Observation of scratches | ○ | ○ | ○ | Δ | x | Δ | ○ |
| pH of polishing slurry | 9.32 | 9.32 | 9.31 | 9.34 | 9.36 | 9.30 | 9.33 |
| Corrosion of polishing object | Absent | Absent | Absent | Absent | Absent | Absent | Absent |

TABLE 2

|  |  | Ex. 6 | Ex. 7 | Ex. 8 | Ex. 9 | C. Ex. 3 | C. Ex. 4 | Ex. 10 |
|---|---|---|---|---|---|---|---|---|
| Composition of polishing slurry (mass %) | Abrasives | 0.5 | — | 1.0 | 1.0 | 1.0 | 3.0 | 1.0 |
|  | Glycine | 5.0 | 5.0 | 5.0 | 5.0 | 5.0 | 5.0 | 5.0 |
|  | Ammonia | 0.6 | 0.6 | 0.6 | 0.6 | 0.6 | 0.6 | 0.6 |
|  | Alkylbenzenesulfonate | 1.2 | 1.2 | 0.6 | 0.3 | 0.1 | — | 1.2 |
|  | Polycarboxylate 1 | 0.5 | 0.5 | 0.5 | 0.5 | 0.5 | 0.5 | — |
|  | Polycarboxylate 2 | — | — | — | — | — | — | 0.5 |
|  | Polycarboxylate 3 | — | — | — | — | — | — | — |
|  | Hydrogen peroxide solution | 2.0 | 2.0 | 2.0 | 2.0 | 2.0 | 2.0 | 2.0 |
|  | Defoamer | 0.1 | 0.1 | 0.1 | 0.1 | 0.1 | 0.1 | 0.1 |
|  | Water | 90.1 | 90.6 | 90.2 | 90.5 | 90.7 | 88.8 | 89.6 |
| RR (μm/min) |  | 3.36 | 1.35 | 4.60 | 5.15 | 5.60 | 7.86 | 4.20 |
| ER (nm/min) |  | 11.9 | 10.0 | 11.2 | 14.2 | 21.6 | 528.3 | 12.5 |
| Observation of scratches |  | ○ | ○ | ○ | Δ | — | — | ○ |
| pH of polishing slurry |  | 9.36 | 9.37 | 9.37 | 9.36 | 9.36 | 9.37 | 9.35 |
| Corrosion of polishing object |  | Absent | Absent | Absent | Absent | Present | Present | Absent |

TABLE 3

|  |  | Ex. 11 | Ex. 12 | Ex. 13 | C. Ex. 5 | Ex. 14 | Ex. 15 | Ex. 16 | Ex. 17 | Ex. 18 | Ex. 19 | C. Ex. 6 | C. Ex. 7 |
|---|---|---|---|---|---|---|---|---|---|---|---|---|---|
| Composition of polishing slurry (mass %) | Abrasives | 3.0 | 3.0 | 3.0 | 3.0 | 2.0 | 1.0 | 0.5 | 0.0 | 1.0 | 1.0 | 1.0 | 3.0 |
|  | Glycine | 5.0 | 5.0 | 5.0 | 5.0 | 5.0 | 5.0 | 5.0 | 5.0 | 5.0 | 5.0 | 5.0 | 5.0 |
|  | Ammonia | 0.6 | 0.6 | 0.6 | 0.6 | 0.6 | 0.6 | 0.6 | 0.6 | 0.6 | 0.6 | 0.6 | 0.6 |
|  | Alkylbenzenesulfonate | 1.2 | 1.2 | 1.2 | 1.2 | 1.2 | 1.2 | 1.2 | 1.2 | 0.6 | 0.3 | 0.1 | — |
|  | Polycarboxylate 1 | — | — | — | — | — | — | — | — | — | — | — | — |
|  | Polycarboxylate 2 | — | — | — | — | — | — | — | — | — | — | — | — |
|  | Polycarboxylate 3 | 0.1 | 0.3 | 0.5 | 1.0 | 0.5 | 0.5 | 0.5 | 0.5 | 0.5 | 0.5 | 0.5 | 0.5 |
|  | Hydrogen peroxide solution | 2.0 | 2.0 | 2.0 | 2.0 | 2.0 | 2.0 | 2.0 | 2.0 | 2.0 | 2.0 | 2.0 | 2.0 |
|  | Defoamer | 0.1 | 0.1 | 0.1 | 0.1 | 0.1 | 0.1 | 0.1 | 0.1 | 0.1 | 0.1 | 0.1 | 0.1 |
|  | Water | 88.0 | 87.8 | 87.6 | 87.1 | 88.6 | 89.6 | 90.1 | 90.6 | 90.2 | 90.5 | 90.7 | 88.8 |
| RR (μm/min) |  | 4.26 | 4.35 | 4.42 | 4.51 | 4.04 | 3.52 | 2.78 | 1.09 | 3.82 | 4.16 | 4.34 | 5.77 |
| ER (nm/min) |  | 12.7 | 10.9 | 12.7 | 43.4 | 14.5 | 14.5 | 10.9 | 16.3 | 12.7 | 14.5 | 21.7 | 514.1 |
| Observation of scratches |  | ○ | ○ | ○ | Δ | ○ | ○ | ○ | ○ | ○ | ○ | ○ | ○ |
| pH of polishing slurry |  | 9.40 | 9.37 | 9.37 | 9.38 | 9.37 | 9.37 | 9.37 | 9.38 | 9.37 | 9.37 | 9.38 | 9.41 |
| Corrosion of polishing object |  | Absent | Absent | Absent | Present | Absent | Absent | Absent | Absent | Absent | Absent | Present | Present |

As shown in Tables 1 to 3, the polishing slurry of each of Examples has a removable rate higher than that of the polishing slurry of Comparative Example 1 as long as they have an equivalent amount of abrasives. Also as shown in Tables 1 to 3, the polishing slurry of each of Examples has an etching rate lower than that of the polishing slurry of each of Comparative Examples 2 and 5 in which an amount of polycarboxylic acid is 1.0 mass %, and Comparative Examples 3, 4, 6, and 7 in which an amount of alkylbenzenesulfonic acid is 0.1 mass % or lower.

TEST EXAMPLES

A solution of each of Test Examples having the compositions shown in Table 4 below was prepared. Using the solution in place of the polishing slurry, the aforementioned etching rate test was performed and a pH of the solution was measured.

TABLE 4

| | | Test Ex. 1 | Test Ex. 2 | Test Ex. 3 | C. Ex. 4 |
|---|---|---|---|---|---|
| Composition of solution (mass %) | Abrasives | 3.0 | 3.0 | 3.0 | 3.0 |
| | Glycine | 5.0 | 5.0 | 5.0 | 5.0 |
| | Ammonia | 0.6 | 0.6 | 0.6 | 0.6 |
| | Alkylbenzenesulfonate | 1.2 | 1.2 | — | — |
| | Polycarboxylate 1 | — | 2.0 | — | 0.5 |
| | Polycarboxylate 2 | — | — | — | — |
| | Polycarboxylate 3 | — | — | — | — |
| | Hydrogen peroxide solution | 2.0 | 2.0 | 2.0 | 2.0 |
| | Defoamer | 0.1 | 0.1 | 0.1 | 0.1 |
| | Water | 88.1 | 86.1 | 89.3 | 88.8 |
| ER (nm/min) | | 10.9 | 66.0 | 363.0 | 528.3 |
| pH of polishing slurry | | 9.36 | 9.47 | 9.35 | 9.37 |

The invention claimed is:

1. A polishing slurry for polishing copper or a copper alloy, the polishing slurry comprising abrasives, an organic acid, an oxidizing agent, and alkali, the polishing slurry further comprising a polycarboxylic acid, and an alkylbenzenesulfonic acid, wherein
a concentration of the polycarboxylic acid is 0.1 to 0.5 mass %,
a concentration of the alkylbenzenesulfonic acid is 0.3 mass % or more,
the polishing slurry has a pH of 9.0 or more, and
the polishing slurry further comprises glycine as the organic acid.

2. The polishing slurry according to claim 1, comprising hydrogen peroxide as the oxidizing agent.

3. The polishing slurry according to claim 1, comprising ammonia as the alkali.

4. The polishing slurry according to claim 1, wherein a concentration of the abrasives is 1.0 mass % or less.

5. The polishing slurry according to 2, comprising ammonia as the alkali.

* * * * *